(12) United States Patent
Wilson

(10) Patent No.: US 9,007,106 B2
(45) Date of Patent: Apr. 14, 2015

(54) JITTER SUPPRESSION IN TYPE I DELAY-LOCKED LOOPS

(75) Inventor: William Burdett Wilson, Macungie, PA (US)

(73) Assignee: Cisco Technology Inc., San Jose, CA (US)

( * ) Notice: Subject to any disclaimer, the term of this patent is extended or adjusted under 35 U.S.C. 154(b) by 167 days.

(21) Appl. No.: 13/528,951

(22) Filed: Jun. 21, 2012

(65) Prior Publication Data

US 2014/0077850 A1   Mar. 20, 2014

Related U.S. Application Data

(60) Provisional application No. 61/503,223, filed on Jun. 30, 2011.

(51) Int. Cl.
  *H03L 7/06* (2006.01)
  *H03L 7/08* (2006.01)
  *H03L 7/081* (2006.01)

(52) U.S. Cl.
  CPC ............... *H03L 7/08* (2013.01); *H03L 7/0805* (2013.01); *H03L 7/0816* (2013.01)

(58) Field of Classification Search
  USPC .................... 327/147, 156, 149, 158
  See application file for complete search history.

(56) References Cited

U.S. PATENT DOCUMENTS

| 5,777,501 | A | 7/1998 | AbouSeido |
| 6,316,987 | B1 | 11/2001 | Dally et al. |
| 7,197,102 | B2 | 3/2007 | Rhee et al. |
| 7,200,782 | B2 | 4/2007 | Vining |
| 7,292,079 | B2 | 11/2007 | Huang et al. |
| 7,342,985 | B1 | 3/2008 | Stene |
| 7,420,399 | B2 * | 9/2008 | Han .............................. 327/175 |
| 7,456,674 | B2 | 11/2008 | Oakland |
| 7,599,458 | B2 | 10/2009 | Naffziger et al. |
| 7,733,138 | B2 * | 6/2010 | Uehara et al. ................. 327/158 |
| 8,019,022 | B2 | 9/2011 | Liu et al. |
| 2007/0030041 | A1 | 2/2007 | Huang et al. |
| 2007/0103216 | A1 | 5/2007 | Han |
| 2011/0176647 | A1 | 7/2011 | Li |

FOREIGN PATENT DOCUMENTS

| WO | 2012178097 A1 | 12/2012 |
| WO | 2013052186 A2 | 4/2013 |

OTHER PUBLICATIONS

Ng et al., "A 33mW 8Gb/s CMOS Clock Multiplier and CDR for Highly Integrated I/Os", IEEE 2003 Custom-Integrated Circuits Conference, pp. 77-80.

(Continued)

*Primary Examiner* — Hai L Nguyen
(74) *Attorney, Agent, or Firm* — Patterson & Sheridan, LLP

(57) ABSTRACT

In one embodiment, a delay-locked loop (DLL) for synchronizing a phase of a periodic digital output signal with a phase of a periodic digital input signal includes a deskew element responsive to the periodic digital input signal to the DLL and the periodic digital output signal from the DLL for suppressing jitter in the periodic digital output signal by synchronizing transitions in the periodic digital output signal with transitions in the periodic digital input signal and generating a final jitter-suppressed periodic digital output signal.

19 Claims, 5 Drawing Sheets

(56) References Cited

OTHER PUBLICATIONS

Maneatis, "Low-Jitter Process-Independent DLL and PLL Based on Self-Biased Techniques", IEEE Journal of Solid-State Circuits, vol. 31, No. 11, Nov. 1996, pp. 1723-1732.

Yang, "Delay-Locked Loops-An Overview", from Phase-Locking in High-Performance Systems, IEEE Press, 2003, pp. 13-22.

Lee, et al., "Jitter Transfer Characteristics of Delay-Locked Loops-Theories and Design Techniques", IEEE Journal of Solid-State Circuits, vol. 38, No. 4, Apr. 2003, pp. 614-621.

Park, et al., "A Low Jitter Delay-Locked Loop With Harmonic-Lock Prevention", IEICE Trans. Fundamentals, vol. E85-A, Nov. 2, Feb. 2002, pp. 505-507.

* cited by examiner

JITTER SUPPRESSION IN TYPE I DELAY-LOCKED LOOPS

CROSS-REFERENCE TO RELATED APPLICATIONS

This application claims the benefit of U.S. Provisional Application No. 61/503,223 filed Jun. 30, 2011 and herein incorporated by reference.

GOVERNMENT RIGHTS IN THE INVENTION

This invention was made with United States Government support under DARPA Contract No. HR0011-11-C-0037. THE GOVERNMENT HAS CERTAIN RIGHTS IN THIS INVENTION.

TECHNICAL FIELD

The present disclosure relates generally to jitter suppression in a Type I Delay-Locked Loop (DLL).

BACKGROUND

A delay-locked loop (DLL) is a digital circuit used to controllably monitor and adjust the phase of a periodic digital output signal with respect to a periodic digital input signal (for example, a clock signal). In general, a DLL is a servo-mechanism in which a delay path is adjusted in order to produce a desired phase relationship between the input and output signals. DLLs have been widely used as frequency synthesizers and clock circuits in transceivers, inter-chip communication interfaces and clock distribution networks.

In a "Type I" DLL, a reference signal is compared with a delayed version of itself in performing the phase comparison and generating the output signal. A conventional Type I DLL comprises a delay line, a phase detector element and a loop filter (integrator) that are used to create an output signal that is phase-matched (i.e., "locked") to the input signal. The phase detector and loop filter form a feedback path for controlling the length of the delay line necessary for phase matching.

One problem with obtaining an output signal that is properly locked on the input signal phase is the presence of noise in the form of jitter ($\delta$) within the propagating signals. As is well-known in the art, "jitter" can be defined as a variability in the arrival time of an edge of a periodic signal as a result of the presence of noise within the signal (in most cases, the noise exhibits a Gaussian distribution about the expected edge). In the DLL structure, jitter may be present on both the input signal to the delay line and the output signal from the delay line. Indeed, there may be an accumulation of jitter at the output, denoted as jitter peaking, which refers to the amplification of jitter from the input as it propagates through the delay line and ultimately appears at the output. Jitter results in introducing timing errors in the output signal.

BRIEF DESCRIPTION OF THE DRAWINGS

The accompanying drawings, which are incorporated in and constitute a part of this disclosure, illustrate various embodiments of the present invention. In the drawings.

DESCRIPTION OF EXAMPLE EMBODIMENTS

Overview

Figure 1:
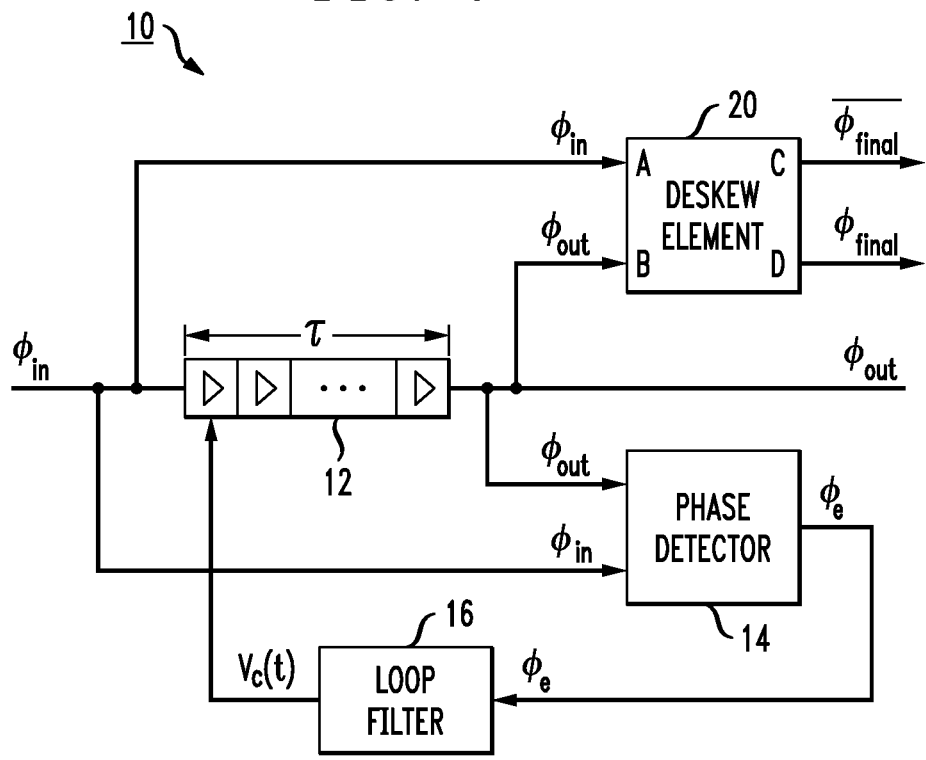
FIG. 1 illustrates an example of a Type I DLL apparatus including a deskewing element.

Consistent with embodiments of the present invention, apparatus, systems and methods are disclosed for suppressing jitter in DLLs.

Delay-locked loop (DLL) apparatus for synchronizing a phase of a periodic digital output signal with a phase of a periodic digital input signal includes a delay line of a controllable phase delay $\tau$ that generates the periodic digital output signal as a delayed version of the periodic digital input signal. The combination of a phase detector and a loop filter are used to generate a control voltage that adjusts the length of the controllable phase delay to match the phase of the periodic digital output signal with the phase of the periodic digital input signal. The apparatus also includes a deskew element responsive to the periodic digital input signal and the periodic digital output signal for suppressing jitter in the periodic digital output signal by synchronizing transitions in the periodic digital output signal with transitions in the periodic digital input signal to generate a final jitter-suppressed periodic digital output signal.

An example clock recovery system uses the jitter-suppressed output from the DLL apparatus as an input to a secondary delay line. The secondary delay line is adjustable in phase by a secondary control voltage that is related to the above-defined control voltage to form an output jitter-suppressed clock signal that is phase-matched to the original periodic digital input signal. The secondary delay line may include a number of taps distributed along the length thereof to allow for a plurality of sub-interval clock signals to be generated.

An example method of suppressing jitter in a periodic digital output signal from a delay-locked loop (DLL) includes the steps of receiving a periodic digital input signal $\phi_{in}$ having a predetermined period T, delaying the input periodic digital signal by an adjustable period of time $\tau$ to form the periodic digital output signal $\phi_{out}$, comparing a phase of $\phi_{in}$ to a phase of $\phi_{out}$ and forming a phase error output signal $\phi_e$ representative of a phase difference therebetween, generating a loop control signal from the phase error output signal for adjusting $\tau$ to reduce the value of the phase error signal and deskewing the periodic digital output signal with respect to the periodic digital input signal to suppress jitter present in the periodic digital output signal and create a final output signal. The deskewing may be performed by latching the transition of the periodic digital output signal with the periodic digital input signal such that the final output signal is created only when the periodic digital input signal and the periodic digital output signal are of the same state.

DETAILED DESCRIPTION

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

FIG. 1 illustrates a general embodiment of a Type I delay-locked loop (DLL) 10 including jitter suppression. A Type I DLL 10 comprises a delay line 12, a phase detector element 14 and a loop filter 16. A periodic signal with a known phase $\phi_{in}$ and period T is applied as an input to delay line 12, which imparts a controllable amount of phase delay $\tau$ to the incoming signal. The output periodic signal exhibits a phase $\phi_{out}$ that differs from the input by the "length" $\tau$ of delay line 12. Ideally, at a specific point in time n, the following relationship is found:

$$\phi_{out(n)} = \tau \phi_{in(n-1)},$$

with the quantity (n−1) defining the previous point in time, as separated by the period T of the signal.

Phase detector 14 compares a current value of input signal $\phi_{in}$ to the value of output signal $\phi_{out}$, providing as an output a "phase error signal" $\phi_e$ indicative of the phase difference between the two signals at the same point in time, that is:

$$\phi_e = \phi_{out(n)} - \phi_{in(n)}$$
$$= \tau \phi_{in(n-1)} - \phi_{in(n)}.$$

In the absence of any noise (jitter) on the waveform of a periodic input signal, the period T is defined as the separation in time between the occurrence of the same "edge" (for example, rising edge) of the waveform, that is:

$$T = \phi_{in(n)} - \phi_{in(n-1)}$$
$$= \tau \phi_{in(n-1)} - \phi_{in(n-1)}.$$

Figure 2:
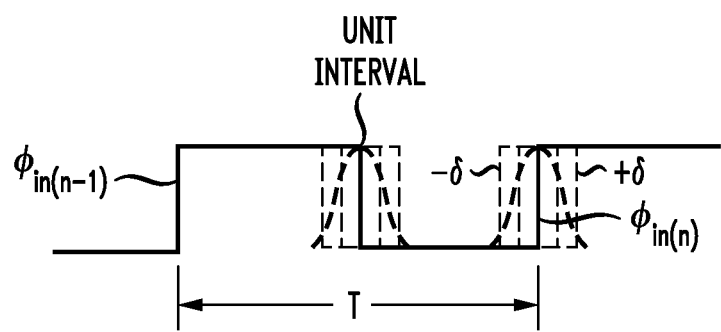
FIG. 2 depicts the presence of jitter on a periodic digital signal.

However, in some cases there may be jitter (denoted $\delta$) present on the edge of the periodic signal as a result of the presence of noise within the signal. FIG. 2 shows a periodic digital signal with a defined period T, illustrating the possibility of jitter $\delta$ on either the falling or rising edge of the signal. As shown in this particular example, the jitter may exhibit a Gaussian distribution around an expected edge arrival time location, and may cause the edge of a signal transition to "lag" its expected location ($-\delta$) or "lead" the expected location ($+\delta$). With this information, the above "ideal" relation of period T can be re-defined as follows to account for the presence of jitter:

$$T = \tau \phi_{in(n-1)} - (\phi_{in(n-1)} + \delta)$$
$$= (\tau - 1)\phi_{in(n-1)} - \delta.$$

The term ($\tau$−1) is associated with the presence of "error" in defining the length of the delay line itself, with $\delta$ defining the jitter in the input signal (also referred to as "cycle-to-cycle" jitter).

The error signal output $\phi_e$ from phase detector 14 passes through loop filter 16 and produces a control voltage signal $V_c(t)$ that functions to control the length $\tau$ of delay line 12 so as to reduce the phase difference between the input and output phases attributed to the operation of the delay line itself (i.e., the ($\tau$−1) component), providing phase matching between the periodic digital input signal and the periodic digital output signal.

One problem with obtaining and maintaining a locked output on the proper phase is the presence of jitter $\delta$ in the system. As stated above, there may be jitter associated with a periodic digital signal, in terms of the location of a rising (or falling) edge of the periodic digital signal. In the DLL structure, jitter may be present on both the input signal to the delay line and the output signal from the delay line. Indeed, there may be an accumulation of jitter at the output, denoted as jitter peaking, which refers to the amplification of jitter from the input as it propagates through the delay line and ultimately appears at the output. To better define the operation of DLL 10, the jitter may be included in defining the arrival time of an edge transition in the phase signal.

Jitter peaking occurs in Type I DLLs (such as DLL 10) since it cannot distinguish between jitter associated with the input signal and jitter associated with the output signal (i.e., since one signal is just a delayed version of the other). That is, when phase detector 14 sees $\phi_{in}$ lag $\phi_{out}$, it could mean that $\phi_{in}$ has a sudden lagging jitter, or that the delay value $\tau$ of delay line 12 has decreased. The former requires that the length of delay line 12 be decreased, while the latter requires that $\tau$ be increased to prevent jitter in $\phi_{out}$. Clearly, these two scenarios have conflicting requirements. Since a Type I DLL adjusts the delay between a given signal and a delayed version of itself, the length of the delay line should only be increased (decreasing the length may lead to positive feedback). As a result, any "sudden" jitter in $\phi_{in}$ may possibly be ignored by phase detector 14, allowing this jitter to be temporarily amplified as it propagates along delay line 12 and affects $\phi_{out}$.

Figure 3:
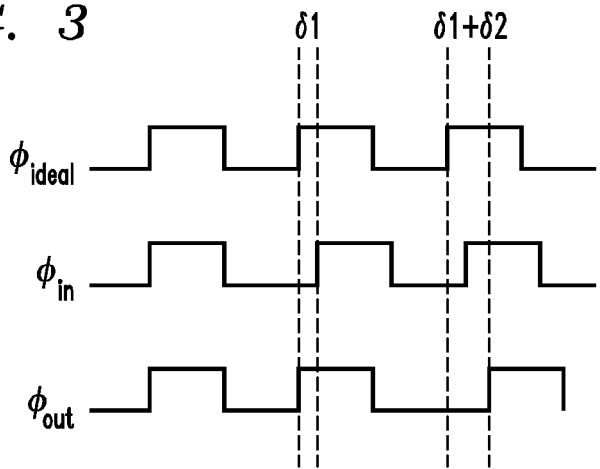
FIG. 3 depicts jitter peaking on a periodic digital output signal from a DLL.
Figure 4:
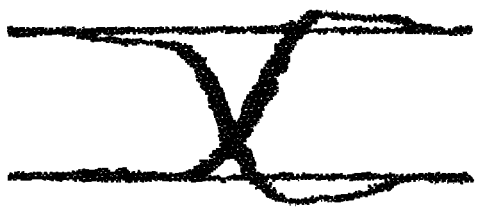
FIG. 4 is an example eye diagram showing jitter peaking on a periodic digital output signal from a DLL.

FIG. 3 illustrates jitter peaking in the time domain for DLL 10 of FIG. 1. As shown, input signal $\phi_{in}$ and output signal $\phi_{out}$ both follow an ideal periodic digital signal with a defined period T until a jitter $\delta_1$ occurs in the periodic digital input signal. Since this jitter has not yet propagated to the output, phase detector 14 sees an instantaneous phase difference $\phi_e$ between the outputs, as noted in FIG. 3, and interprets this difference as a decrease in delay. As a result, the delay $\tau$ is increased by $\delta_2$, creating an overall phase jitter of $\delta_1 + \delta_2$ at the next portion of the output signal. FIG. 4 is an eye diagram illustrating the presence of this type of cycle-to-cycle jitter.

Previously, jitter peaking has been addressed by decreasing the bandwidth of loop filter 14 (for example, increasing the capacitance when an RC filter is used as the loop filter) which somewhat limits the amount of slowly varying jitter that is seen by filter 14. While this is helpful, jitter amplification may still be present in the form of high-frequency jitter that is not eliminated by modifying the bandwidth of the loop filter.

In accordance with a particular embodiment of the present invention, high-frequency jitter may be suppressed by including a deskew element 20 at the output of delay line 12. As shown in FIG. 1, input signal $\phi_{in}$ and output signal $\phi_{out}$ are applied as separate inputs to deskew element 20, where in this example input signal $\phi_{in}$ is shown as coupled to input port A of deskew element 20 and output signal $\phi_{out}$ is shown as coupled to input port B of deskew element 20. In operation, deskew element 20 functions to ensure that jitter present on output signal $\phi_{out}$ is essentially suppressed such that the final output signal $\phi_{final}$ from DLL 10 is relatively "clean" (that is, synchronized with the input signal).

In particular embodiments, deskew element 20 functions to synchronize the current value of the delay line output signal $\phi_{out}(n)$ with the current value of the delay line input signal $\phi_{in}(n)$ by not permitting the output of deskew element 20 to change state until both inputs are the same state. That is, the arrival of an "edge" transition for the delay line output signal will not propagate through deskew element 20 unless and until an "edge" of the delay line input signal is also present, thus latching the output with the input. Thus, if there is skew between a rising edge at input port A and a falling edge at input port B, deskew element 20 essentially eliminates the skew (regardless of its polarity) at the output, creating synchronized output signals at ports C and D. "Skew polarity" may be defined as including situations where either the output signal phase either "lags" the input signal phase (−δ) or "leads" the input signal (+δ). Summarizing, deskew element 20 functions to exhibit a variable delay that is inversely related to the jitter present on the delay line output signal, providing a "final" DLL output signal $\phi_{final}$ only when both the delay line input signal (the periodic digital input signal) and the delay line output signal (the periodic digital output signal) have the same value, regardless of the arrival time of the transition edge of the output signal.

Figure 5:
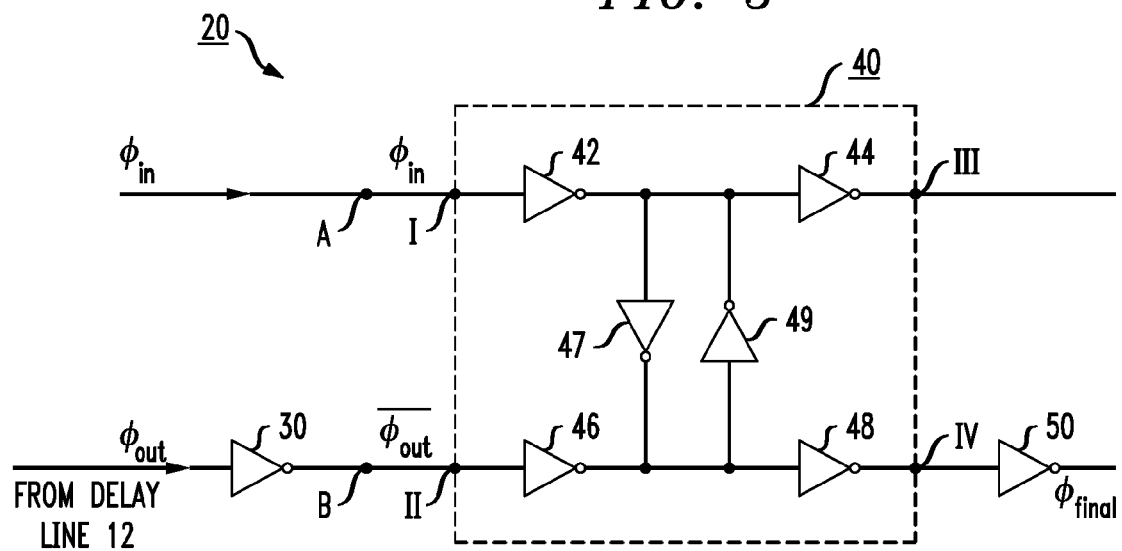
FIG. 5 is an example deskewing element for use in a Type I DLL.
Figure 6:
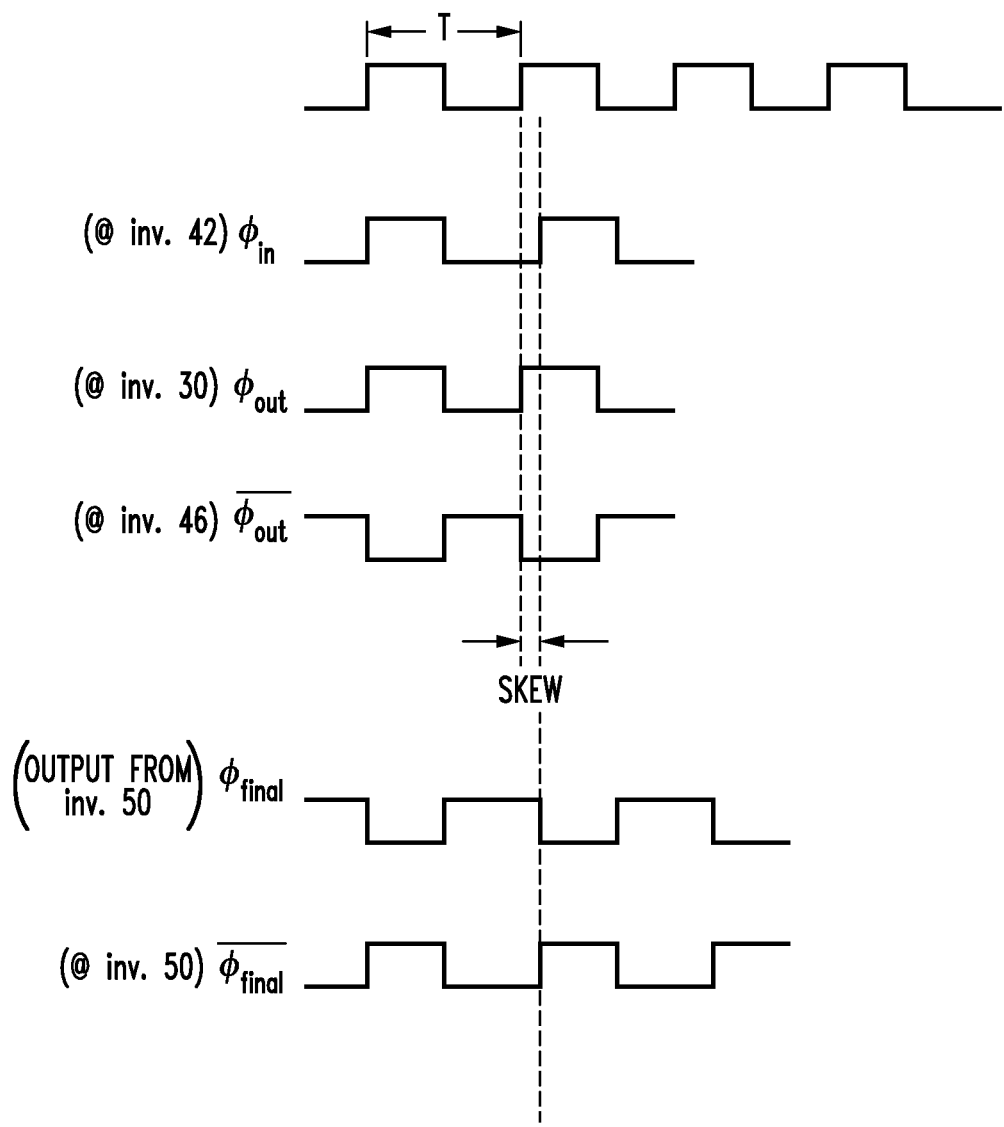
FIG. 6 is an example timing diagram associated with the deskewing element of FIG. 5.

FIG. 5 illustrates an example embodiment of deskew element 20. In this particular embodiment, deskew element 20 comprises an input inverter 30, a latching module 40 and an output inverter 50. FIG. 6 is a timing diagram associated with the operation of the arrangement of FIG. 5. Since the particular configuration shown in FIG. 5 may use complementary inputs for latching module 40 to recognize and eliminate skew, input inverter 30 may be used between the output of delay line 12 and input port II of latching module 40 to create a complementary form of the output from delay line 12, shown as $\overline{\phi_{out}}$ in FIG. 5. It is to be understood that a different configuration of a latching module may not utilize an inverter at the input. Latching module 40 is shown as comprising a first pair of inverters 42 and 44 disposed between input port I and output port III of module 40 and a second pair of inverters 46 and 48 disposed between input port II and output port IV of module 40. A first cross-coupled inverter 47 is disposed between the output of inverter 42 and the input of inverter 48, and a second cross-coupled inverter 49 is disposed between the output of inverter 46 and the input of inverter 44.

With reference to FIG. 6, when the falling edge of signal $\overline{\phi_{out}}$ at port II of module 40 occurs essentially simultaneously with the rising edge of signal $\phi_{in}$ at port I of module 40, this is indicative of having little or no jitter present in the periodic digital output signal from delay line 12. Stated another way, there is relatively little skew present between inputs I and II of module 40. In this case, cross-coupled inverters 47 and 49 will simultaneously change state and allow the input signals to propagate through to output ports III and IV, forming outputs $\overline{\phi_{final}}$ and $\phi_{final}$, respectively.

However, when there is perceptible jitter present in the periodic digital output signal from delay line 12, the arrival time of its transition edge will differ from the arrival time of the input signal transition, taking the form of a variable delay ("skew") between the rising edge of input signal $\phi_{in}$ at inverter 42 and the falling edge of signal $\overline{\phi_{out}}$ appearing at inverter 46 (identified as "skew" in FIG. 6). In this case, there will be a period of time when the cross-coupled inverters 47 and 49 will be of opposite states, thus preventing the first-arriving edge from propagating from the input ports to the output ports of module 40. Only when both inputs I and II are of the same state will cross-coupled inverters 47 and 49 allow the input signals to propagate through the module and appear at output ports III and IV. As shown in FIG. 6, this delay imparted by module 40 functions to reduce the skew between the input signals; that is, the jitter remaining in the output from delay line 12 is suppressed.

Jitter suppression may be of particular interest in a system that uses a Type I DLL as a clock generation/recovery arrangement. Such a system may prefer a "clean" clock signal with rising and falling edges that are predictable and reliable (i.e., not significantly influenced by the presence of jitter).

Figure 7:
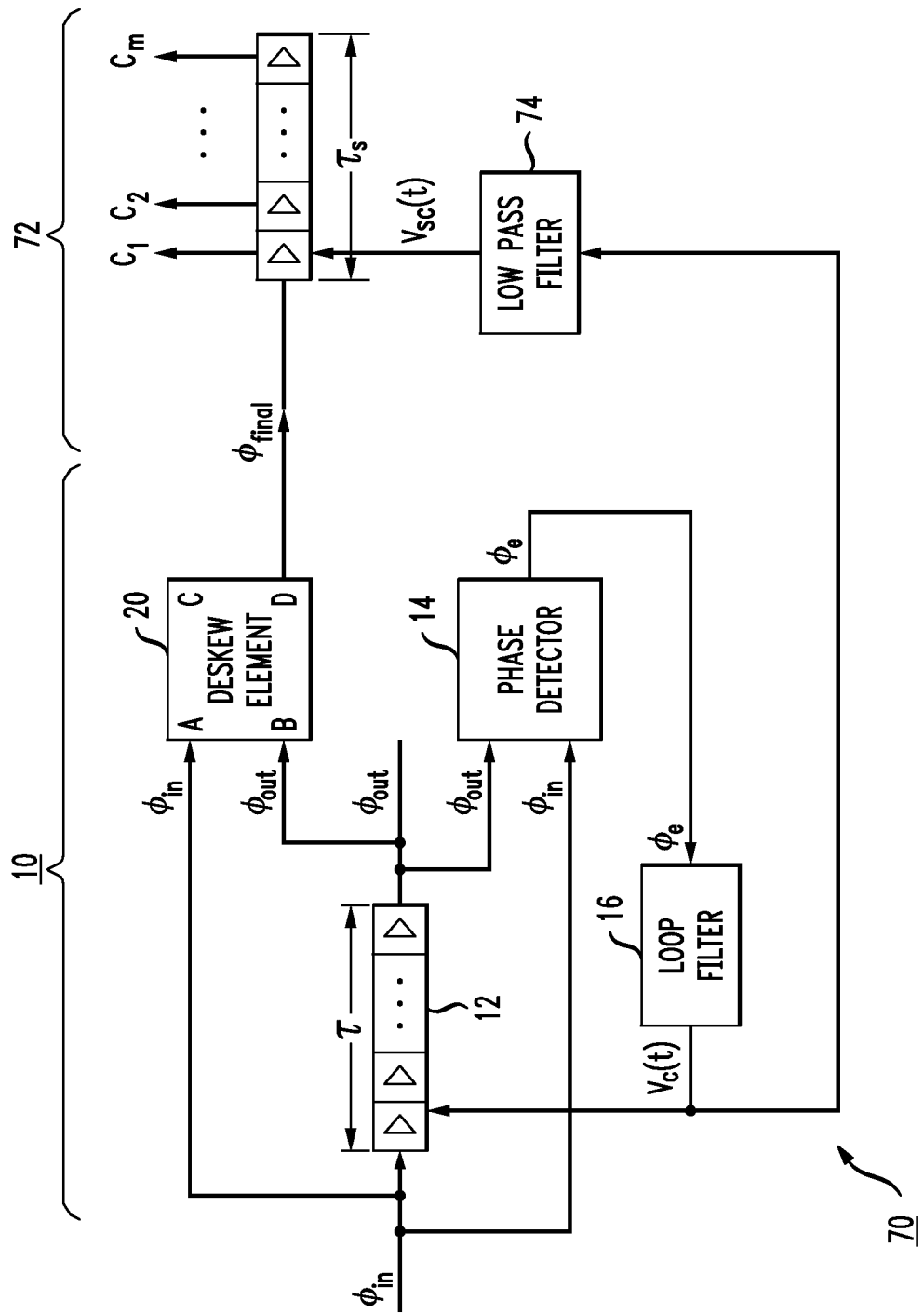
FIG. 7 is an example clock recovery system including a master/slave arrangement of a Type I DLL to form a clock source.

FIG. 7 illustrates an example clock generation/recovery system 70 using jitter-suppressed DLL 10 as an input ("master") component in a "master/slave" arrangement. An output ("slave") component 72 may comprise a low pass filter 74 and a secondary delay line 76. Output component 72 may be used to generate one or more output clock signals for system 70. In this particular embodiment, a clean, jitter-suppressed output phase signal $\phi_{final}$ from deskew element 20 may be applied as an input to secondary delay line 76. Control voltage $V_c(t)$ passes through low pass filter 74 to form a secondary control signal $V_{SC}(t)$ that may be used to adjust the length $\tau_s$ of secondary delay line 76. As shown, various output clock signals, $C_1, C_2, \ldots, C_M$, exhibiting discrete sub-interval periods, may be tapped off of delay line 76 as a set of clock signal outputs from system 70.

Figure 8:
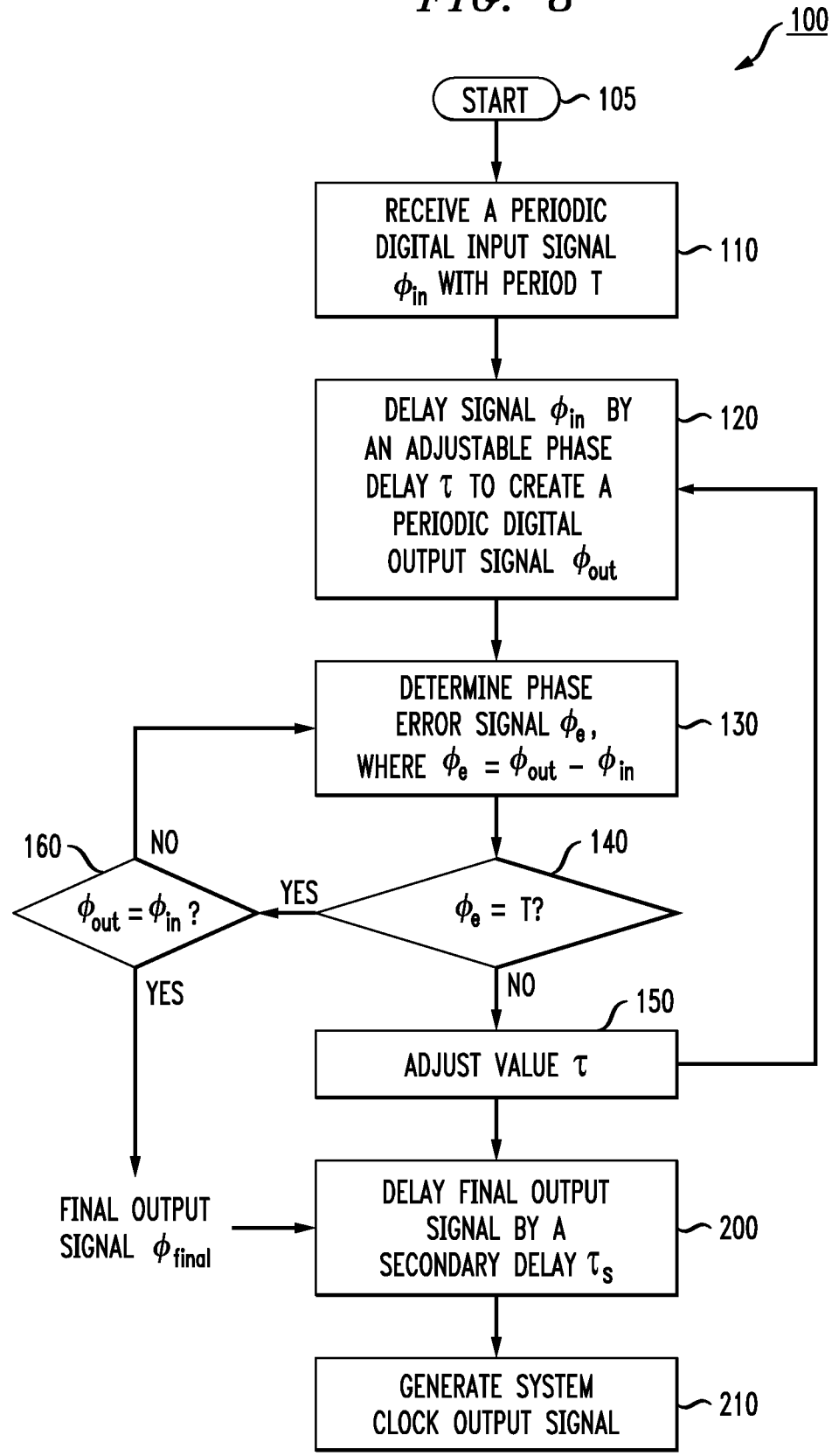
FIG. 8 is a flow chart of an example method for suppressing jitter in a Type I DLL.

FIG. 8 is a flow chart of an example method 100 for suppressing jitter in a DLL output signal. Method 100 may be implemented using conventional system elements to perform the desired functions, in keeping with particular embodiments as shown, for example, in FIGS. 1, 6 and 7. This example method begins at starting block 105 and proceeds to stage 110, where DLL 10 may receive an input digital periodic signal $\phi_{in}$, with a period T. A random amount of jitter δ may be present as a function of the Gaussian nature of this signal (see FIG. 2). From stage 110, the method may progress to stage 120 where the input digital periodic signal is passed through delay line 12 to form an output periodic signal $\phi_{out}$ having essentially the same period T as the input signal. The output signal also includes a phase delay τ defined by the length of delay line 12. As discussed above, there may be jitter present in the output signal, perhaps in the form of accumulated jitter as the signal propagates through the individual delay elements).

The output from stage 120 may progress to stage 130 which determines the phase difference between the input and output signals, defined as a phase error signal. Next, the output from stage 130 may progress to stage 140 where the phase error signal is compared to the known period T of the input signal. If the values are essentially the same, a determination may be made that there is no need to adjust the value of τ. Otherwise, a stage 150 may be used to adjust the current value of τ and the process returns to stage 120. The method includes a stage 160, which occurs after stage 130, and performs a deskewing operation to suppress jitter remaining on the output signal by comparing the current values of the input and output signals and only permitting the output to be transmitted when the values are equal. If the values differ, this is indicative of the presence of jitter on the output signal, and the process returns to stage 130. When the input and output values are essentially the same, jitter in the output signal has been sufficiently suppressed, and the final output signal, $\phi_{final}$ is generated.

When employing this example method in a system for generating or recovering a clock signal, the method may progress to a stage 200 where the final output signal is delayed by a secondary delay $\tau_s$, with this delay adjustable by, perhaps, the output from stage 150 so as to phase match the secondary delay with the input signal. The output from stage 200 progresses to a stage 210 where at least one clock output signal is generated. Multiple output clock signals, defining sub-intervals of the clock period, may also be generated within stage 210.

While the invention has been described in terms of different embodiments, those skilled in the art will recognize that the invention can be practiced with various modifications that are considered to fall within the spirit and scope of the invention as best defined by the claims appended hereto. Furthermore, while the specification has been described in language specific to structural features and/or methodological acts, the claims are not limited to the features or acts described above. Rather, the specific features and acts described above are disclosed as examples for embodiments of the invention.

What is claimed is:

1. An apparatus comprising
   a delay-locked loop (DLL) for synchronizing a phase of a periodic digital output signal with a phase of a periodic digital input signal including:
   a delay line of a controllable phase delay, responsive to the periodic digital input signal for generating the periodic digital output signal as a delayed version of the periodic digital input signal;
   a phase detector responsive to the periodic digital input and output signals for generating a phase error signal representative of the difference in phase between the periodic digital input and output signals;
   a loop filter responsive to the phase error signal for generating a control voltage, the control voltage applied as a control input to the delay line for adjusting the length of the controllable phase delay to match the phase of the periodic digital output signal with the phase of the periodic digital input signal; and
   a deskew element responsive to the periodic digital input signal and the periodic digital output signal for suppressing a jitter component in the periodic digital output signal by synchronizing transitions in the periodic digital output signal with transitions in the periodic digital input signal and generating a final jitter-suppressed periodic digital output signal, wherein the deskew element comprises a latching module for generating the final output signal.

2. The apparatus as defined in claim 1 wherein the loop filter comprises a low pass filter for generating the control voltage which is indicative of low frequency phase mismatch between the periodic digital input and output signals.

3. The apparatus as defined in claim 1 wherein the
   latching module generates the final output signal in the presence of a transition in a state of the periodic digital input signal.

4. The apparatus as defined in claim 1, further comprising an inverter element disposed between the output of the delay line and the input to the latching module for creating a complementary form of the delay line periodic digital output signal.

5. The apparatus as defined in claim 1, wherein the latching module comprises:
   a first pair of inverters disposed along a first signal path;
   a second pair of inverters disposed along a second signal path;
   a first cross-coupled inverter disposed between an output of a first inverter of the first pair inverters along the first signal path and an input of a second inverter of the second pair of inverters along the second signal path; and
   a second cross-coupled inverter disposed between an output of a first inverter of the second pair of inverters along the second signal path and an input of a second inverter of the first pair of inventers along the first signal path, where the periodic digital input signal is applied as an input to the first inverter of the first pair of inverters and the complementary version of the periodic digital output signal is applied as an input to the first inverter of the second pair of inverters, with the output from the second pair of inverters forming the final output signal from the apparatus.

6. The apparatus as defined in claim 1 wherein the jitter component is associated with an arrival time error in a transition edge of the periodic digital output signal.

7. The apparatus as defined in claim 6 wherein arrival time error exhibits a Gaussian distribution around an expected value.

8. The apparatus as defined in claim 6 wherein the jitter component creates a lagging arrival time error in the transition edge of the periodic digital output signal.

9. The apparatus as defined in claim 6 wherein the jitter component creates a leading arrival time error in the transition edge of the periodic digital output signal.

10. A system for generating a jitter-suppressed digital clock signal comprising:
    an input component for generating a jitter-suppressed periodic digital output signal, the input component including:
      a delay-locked loop (DLL) for synchronizing a phase of a periodic digital output signal with a phase of a periodic digital input signal further including
      a delay line of a first controllable phase delay, responsive to the periodic digital input signal for generating a delayed version thereof as the periodic digital output signal;
      a phase detector responsive to the periodic digital input and output signals for generating a phase error signal representative of a difference in phase between the periodic digital input and output signals;
      a loop filter responsive to the phase error signal for generating a control voltage, the control voltage applied as a control input to the delay line for adjusting the length of the first controllable phase delay to match the phase of the periodic digital output signal with the phase of the periodic digital input signal; and
      a deskew element responsive to the DLL periodic digital input signal and the DLL periodic digital output signal for suppressing a jitter component present in the DLL periodic digital output signal by synchronizing transitions in the DLL periodic digital output signal with transitions in the DLL periodic digital input signal and generating a final jitter-suppressed output signal; and
    an output component for generating a digital clock signal from the jitter-suppressed output signal, the output component including:
      a secondary delay line of a second controllable phase delay, responsive to the jitter-suppressed output signal for introducing the second controllable phase delay to create the digital clock signal at the output thereof; and
      a secondary filter element responsive to the control voltage for creating a secondary control voltage input for the secondary delay line to phase match the jitter-suppressed output signal with the created digital clock signal.

11. The system as defined in claim 10 wherein the jitter component is associated with an arrival time error in a transition edge of the periodic digital output signal.

12. The system as defined in claim 10 wherein the loop filter comprises a low pass filter for generating a control voltage indicative of low frequency phase mismatch between the input and output signals to the secondary delay line.

13. The system as defined in claim 10 wherein the deskew element comprises:
   a latching module for generating the final output signal in the presence of a transition in a state of the DLL periodic digital input signal.

14. The system as defined in claim 13 wherein the latching module comprises:
   a first pair of inverters disposed along a first signal path;
   a second pair of inverters disposed along a second signal path;
   a first cross-coupled inverter disposed between an output of a first inverter of the first pair of inverters along the first signal path and an input of a second inverter of the second pair of inverters along the second signal path; and
   a second cross-coupled inverter disposed between an output of a first inverter of the second pair of inverters along the second signal path and an input of a second inverter of the first pair of inverters along the first signal path, where the DLL periodic digital input signal is applied as an input to the first inverter of the first pair of inverters and the complementary version of the DLL periodic digital output signal is applied as an input to the first inverter of the second pair of inverters, with the output from the second pair of inverters forming the final output signal from the apparatus.

15. The system as defined in claim 10 wherein the secondary delay line generates a plurality of separate clock output signals, each at a separate sub-interval along the length of the secondary delay line.

16. A method of suppressing jitter in a periodic digital output signal from a delay-locked loop (DLL), the method comprising:
   receiving a periodic digital input signal having a predetermined period;
   delaying the input periodic digital signal by a period of time to form the periodic digital output signal;
   comparing a phase of the periodic digital input signal to a phase of the periodic digital output signal and forming a phase error output signal representative of a phase difference therebetween;
   generating a loop control signal from the phase error output signal for adjusting the period of time to reduce the value of the phase error signal; and
   deskewing the periodic digital output signal with respect to the periodic digital input signal to suppress a jitter component present in the periodic digital output signal and create a final output signal, deskewing the periodic digital output signal comprises latching a transition of the periodic digital output signal with the periodic digital input signal such that the final output signal is created only when the periodic digital input signal and the periodic digital output signal are of a same state.

17. The method of claim 16 wherein in performing the deskewing step, the jitter component is defined as associated with an arrival time error in a transition edge of the periodic digital output signal.

18. The method of claim 17 wherein arrival time error exhibits a Gaussian distribution around an expected value.

19. The method of claim 17 further comprising:
   delaying the final output signal by a different period of time to form a jitter-suppressed clock signal; and
   generating a secondary control signal from the loop control signal for adjusting the different period of time and creating the jitter-suppressed clock signal which is synchronized with the periodic digital input signal.

* * * * *